United States Patent
Wang et al.

(10) Patent No.: US 11,307,270 B2
(45) Date of Patent: Apr. 19, 2022

(54) SPIN VALVE WITH BUILT-IN ELECTRIC FIELD AND SPINTRONIC DEVICE COMPRISING THE SAME

(71) Applicant: Institute of Semiconductors, Chinese Academy of Sciences, Beijing (CN)

(72) Inventors: Kaiyou Wang, Beijing (CN); Wenkai Zhu, Beijing (CN); Ce Hu, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 137 days.

(21) Appl. No.: 16/824,253

(22) Filed: Mar. 19, 2020

(65) Prior Publication Data
US 2021/0148999 A1    May 20, 2021

(30) Foreign Application Priority Data

Nov. 14, 2019 (CN) .......................... 201911124047.8

(51) Int. Cl.
| H01L 43/02 | (2006.01) |
| G01R 33/09 | (2006.01) |
| G11C 11/16 | (2006.01) |
| H01L 43/08 | (2006.01) |
| H01L 43/10 | (2006.01) |

(52) U.S. Cl.
CPC .......... *G01R 33/093* (2013.01); *G11C 11/161* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; G11C 11/161; G01R 33/093

USPC .......................................................... 257/421
See application file for complete search history.

(56) References Cited

U.S. PATENT DOCUMENTS

| 2015/0123755 A1* | 5/2015 | Shibata | .................... | G11B 5/65 |
| | | | | 335/296 |
| 2018/0339912 A1* | 11/2018 | Natali | ............... | H01L 21/02439 |
| 2021/0148999 A1* | 5/2021 | Wang | ...................... | H01L 43/10 |

FOREIGN PATENT DOCUMENTS

| CN | 1771613 | 5/2006 | |
| CN | 102945922 | 2/2013 | |
| CN | 103544983 | 1/2014 | |
| CN | 104241355 | 12/2014 | |
| CN | 110190182 | 8/2019 | |
| EP | 0971424 | 1/2000 | |
| WO | WO-03032338 A1 * | 4/2003 | ........... H01F 41/307 |

OTHER PUBLICATIONS

Chinese Office Action in CN Appln No. 201911124047.8, dated Mar. 26, 2021, 13 pages with English Translation.

* cited by examiner

*Primary Examiner* — Jami Valentine Miller
(74) *Attorney, Agent, or Firm* — Fish & Richardson P.C.

(57) ABSTRACT

Exemplary embodiments of the present disclosure provide a spin valve and a spintronic device comprising the same. The spin valve may comprise two or more magnetic layers stacked in sequence, wherein the spin valve further comprises at least one pair of nonmagnetic semiconductor layers arranged between any two adjacent magnetic layers among the two or more magnetic layers, wherein a built-in electric field is formed between the at least one pair of nonmagnetic semiconductor layers.

8 Claims, 4 Drawing Sheets

SPIN VALVE WITH BUILT-IN ELECTRIC FIELD AND SPINTRONIC DEVICE COMPRISING THE SAME

CROSS-REFERENCE TO RELATED APPLICATION(S)

This application claims the priority of Chinese Patent Application No. 201911124047.8 filed on Nov. 14, 2019, the disclosure of which is incorporated herein by reference in its entirety as a reference.

TECHNICAL FIELD

The present disclosure generally relates to the fields of spintronics and spintronic devices, and more particularly, to a spin valve with a built-in electric field and a spintronic device comprising the same.

BACKGROUND

Spintronics based on electron spin degrees of freedom is a rapidly developing field. Compared to traditional electronics based on the electron charge degrees of freedom, spintronic devices may have a small size, a low power consumption, a great performance and a good radiation resistance in many applications. The principle of a spin valve is to induce a magnetoresistance effect by controlling magnetization directions of magnetic layers to have a parallel and antiparallel configuration. Therefore, the magnetoresistance of the spin valve can be determined by the configuration of the magnetization directions of two ferromagnetic electrodes and controlled by an external magnetic field. The magnetoresistance effect facilitates in converting weak magnetic information into strong electrical signal, and thus is widely used in the fields of magnetic detection, magnetic sensing, magnetic data storage and processing technologies, and the like.

However, traditional spin valves or traditional spintronic devices typically require the application of a biasing electric field, for example, a bias voltage or a bias current, for driving. Such a structure is disadvantageous for spintronic devices that need to operate in harsh environments.

Therefore, there is a need for a self-driven spin valve and a spintronic device comprising the same, which can operate at low power consumption or even zero power consumption in a harsh environment.

SUMMARY

The present disclosure is aimed at addressing some or all of the above-mentioned problems.

According to an aspect of the present disclosure, there is provided a self-driven spin valve with a built-in electric field, which may comprise two or more magnetic layers stacked in sequence, wherein the spin valve further comprises at least one pair of nonmagnetic semiconductor layers arranged between any two adjacent magnetic layers among the two or more magnetic layers, wherein a built-in electric field is formed between the at least one pair of nonmagnetic semiconductor layers.

In one embodiment, the at least one pair of nonmagnetic semiconductor layers may be made of semiconductor materials with a same conductivity but different carrier concentrations.

In another embodiment, the at least one pair of nonmagnetic semiconductor layers may be made of semiconductor materials with different conductivities.

In another embodiment, at least one of the two or more magnetic layers may have a fixed magnetization direction, and the other magnetic layers have an unfixed magnetization direction.

In another embodiment, the spin valve further comprises a pinning layer arranged above or below the at least one magnetic layer and configured to fix the magnetization direction of the at least one magnetic layer.

In another embodiment, each of the two or more magnetic layers may be made of at least one of a magnetic metal, a magnetic semimetal, a magnetic semiconductor, a magnetic superconductor, a magnetic insulator, a ferromagnetic material, an antiferromagnetic material, an in-plane magnetic anisotropic material, an out-of-plane magnetic anisotropic material, an organic magnetic material, and an inorganic magnetic material, and a van der Weals magnetic material.

In another embodiment, the spin valve may further comprise one or more nonmagnetic spacer layer arranged between the two or more magnetic layers.

In another embodiment, each of the one or more nonmagnetic spacer layers may be made of at least one of a nonmagnetic semiconductor, a nonmagnetic insulator, a nonmagnetic semimetal, a nonmagnetic metal, and a nonmagnetic superconductor.

According to another aspect of the present disclosure, there is provided a spintronic device comprising the spin valve according to any of the above exemplary embodiments.

In one embodiment, the spintronic device may be a magnetic detector, a magnetic sensor, a magnetic memory, a spin logic device, a spin oscillator, a spin transistor, a spin diode, or a temperature sensor.

DETAILED DESCRIPTION

Hereinafter, embodiments of the present disclosure will be described in detail with reference to the accompanying drawings. It should be understood, however, that the description is only illustrative, and is not intended to limit the scope of the present disclosure. In the following detailed description, for ease of interpretation, many specific details are set forth to provide a comprehensive understanding of embodiments of the present disclosure. However, it is apparent that one or more embodiments may also be implemented without these specific details. In addition, the description of well-known structures and techniques will be omitted to avoid unnecessary confusion with the concept of the present disclosure.

The terms used herein are merely for the description of specific embodiments, and are not intended to limit the scope of the present disclosure. The terms "comprising", "including", etc. used herein indicate the presence of the features, steps, operations and/or parts, but do not exclude the presence or addition of one or more other features, steps, operations or parts.

All terms used herein (including technical and scientific terms) have the meanings generally understood by those skilled in the art, unless otherwise defined. It should be noted that the terms used herein shall be interpreted to have meanings consistent with the context of the specification, and shall not be interpreted in an idealized or too rigid way.

In the case of using the expression similar to "at least one of A, B and C", it should be explained according to the meaning of the expression generally understood by those skilled in the art (for example, "a system having at least one of A, B and C" should include but not limited to a system having only A, a system having only B, a system having only C, a system having A and B, a system having A and C, a system having B and C, and/or a system having A, B and C).

In the accompanying drawings, the same or similar reference signs are used to denote the same or similar structures.

Figure 1:
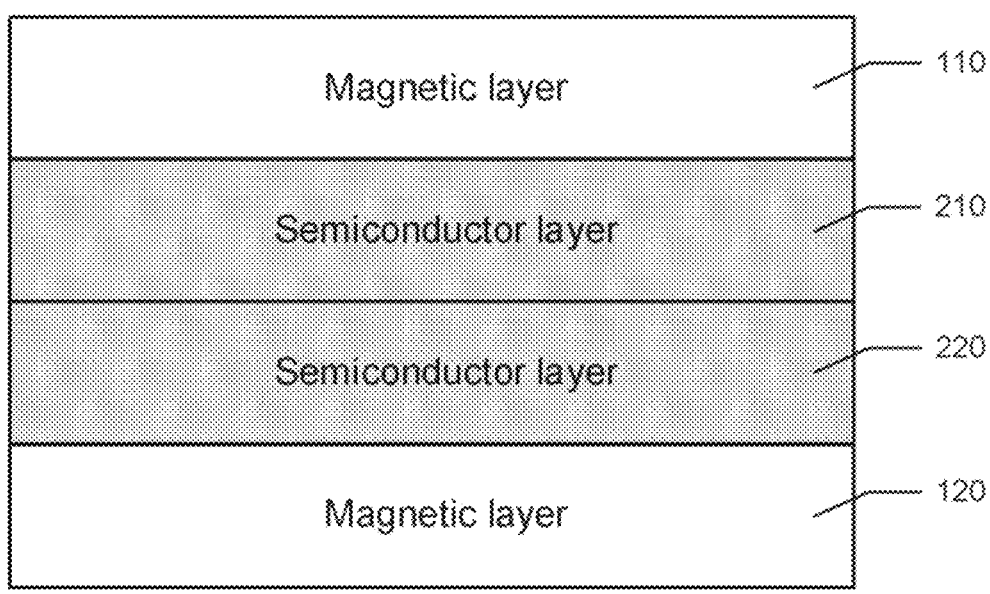
FIG. 1 illustrates a side view of an exemplary structure of a spin valve according to an exemplary embodiment of the present disclosure.

FIG. 1 illustrates a side view of a specific structure of a spin valve according to an exemplary embodiment of the present disclosure.

The spin valve provided in the present disclosure may comprise two or more magnetic layers stacked in sequence, wherein the spin valve may further comprise at least one pair of nonmagnetic semiconductor layers arranged between any two adjacent magnetic layers among the two or more magnetic layers, wherein a built-in electric field is formed between the at least one pair of nonmagnetic semiconductor layers.

For example, the spin valve of the present disclosure comprises a first magnetic layer having a first independent magnetization direction, a second magnetic layer having a second independent magnetization direction, and at least one pair of nonmagnetic semiconductor layers between the first and second magnetic layers to form a multilayer tunnel junction.

Specifically, as shown in FIG. 1, the spin valve may comprise a magnetic layer 110, a magnetic layer 120, and a pair of semiconductor layers 210 and 220 located between the magnetic layer 110 and the magnetic layer 120. The spin valve may induce the magnetoresistance effect by controlling the magnetic moments of the two magnetic layers to have a parallel and antiparallel configuration.

Each of the magnetic layers 110 and 120 may be made of at least one of a magnetic metal, a magnetic semimetal, a magnetic semiconductor, a magnetic superconductor, a magnetic insulator, a ferromagnetic material, an antiferromagnetic material, an in-plane magnetic anisotropic material, an out-of-plane magnetic anisotropic material, an organic magnetic material, an inorganic magnetic material, a van der Waals magnetic material, and other magnetic materials.

The semiconductor layers 210 and 220 may be made of semiconductor materials with same or different conductivities, as long as a built-in electric field can be formed between the semiconductor layers 210 and 220. The built-in electric field may amplify the spin effect or even allow the device to operate by self-driving, thereby eliminating the need for an external biasing electric field and improving the performance of the device.

In particular, the semiconductor layers 210 and 220 may be made of semiconductor material with the same conductivity. In this case, although the semiconductor layers 210 and 220 have the semiconductor material with the same conductivity, they may have different carrier concentrations. For example, if one of the semiconductor layers 210 and 220 is made of heavily doped p-type semiconductor material, the other one may be made of a lightly doped p-type semiconductor material. This may ensure a difference in carrier concentrations between the semiconductor layers 210 and 220, and support carrier diffusion for constructing the built-in electric field between them. In another embodiment, the semiconductor layers 210 and 220 may preferably be made of a p-type semiconductor material and a n-type semiconductor material, respectively, so as to form the built-in electric field, such a structure is more conducive to forming a stable built-in electric field. It should be noted that the semiconductor layers 210 and 220 can not only be made of traditional semiconductor materials with dopants, but also made of two-dimensional semiconductor materials.

As described above, the high and low magnetoresistance of the spin valve is resulted in a parallel configuration or antiparallel configuration of the magnetization directions of the magnetic layers. Thus, the magnetization directions of the magnetic layers may be controlled by applying an external magnetic field. In the embodiment of FIG. 1, the magnetic layers 110 and 120 of the spin valve may both have unfixed magnetization directions. In this case, the unfixed magnetization directions thereof can be both adjusted by applying an external magnetic field. Alternatively, only one of the magnetic layers 110 and 120 has an unfixed magnetization direction, and the other magnetic layer has a fixed magnetization direction. In this case, the magnetization directions of the two layers may have a parallel and antiparallel configuration by adjusting the magnetization direction of the one magnetic layer with the unfixed magnetization direction, thereby forming two different states.

Figure 2:
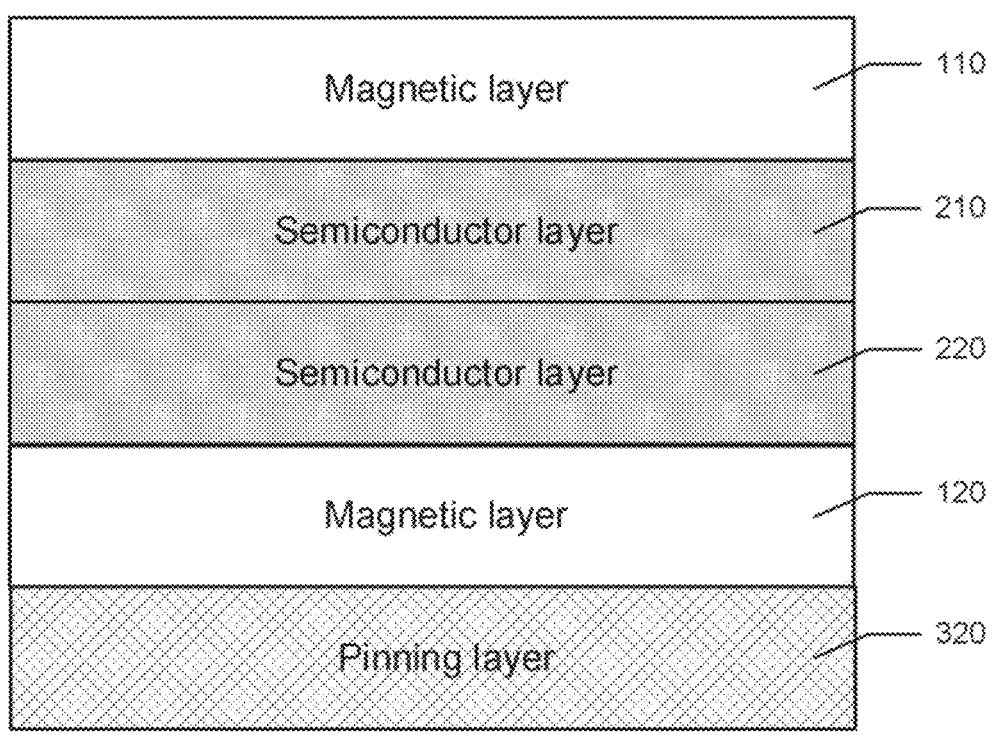
FIG. 2 illustrates a side view of a structure of a spin valve comprising a pinning layer according to an exemplary embodiment of the present disclosure.

As described above, when a certain magnetic layer needs to be implemented as the magnetic layer having the fixed magnetization direction, the spin valve may additionally comprise a pinning layer to fix the magnetization direction of the magnetic layer, as shown in FIG. 2.

FIG. 2 illustrates a side view of a structure of a spin valve comprising a pinning layer according to an exemplary embodiment of the present disclosure. The configuration of the magnetic layers and semiconductor layers in FIG. 2 is the same as that shown in FIG. 1, and therefore will not be described again here.

As shown in FIG. 2, the pinning layer 320 is arranged below the magnetic layer 120 to fix the magnetization direction of the magnetic layer 120. It should be clear to those skilled in the art that the position of the pinning layer is not limited thereto, and in fact, the pinning layer can be arranged above or below the magnetic layer which needs to fix the magnetization direction as required. In addition, various pinning materials (e.g., nickel oxide) that are known or will be known in the future can be used to form the pinning layer.

Figure 3:
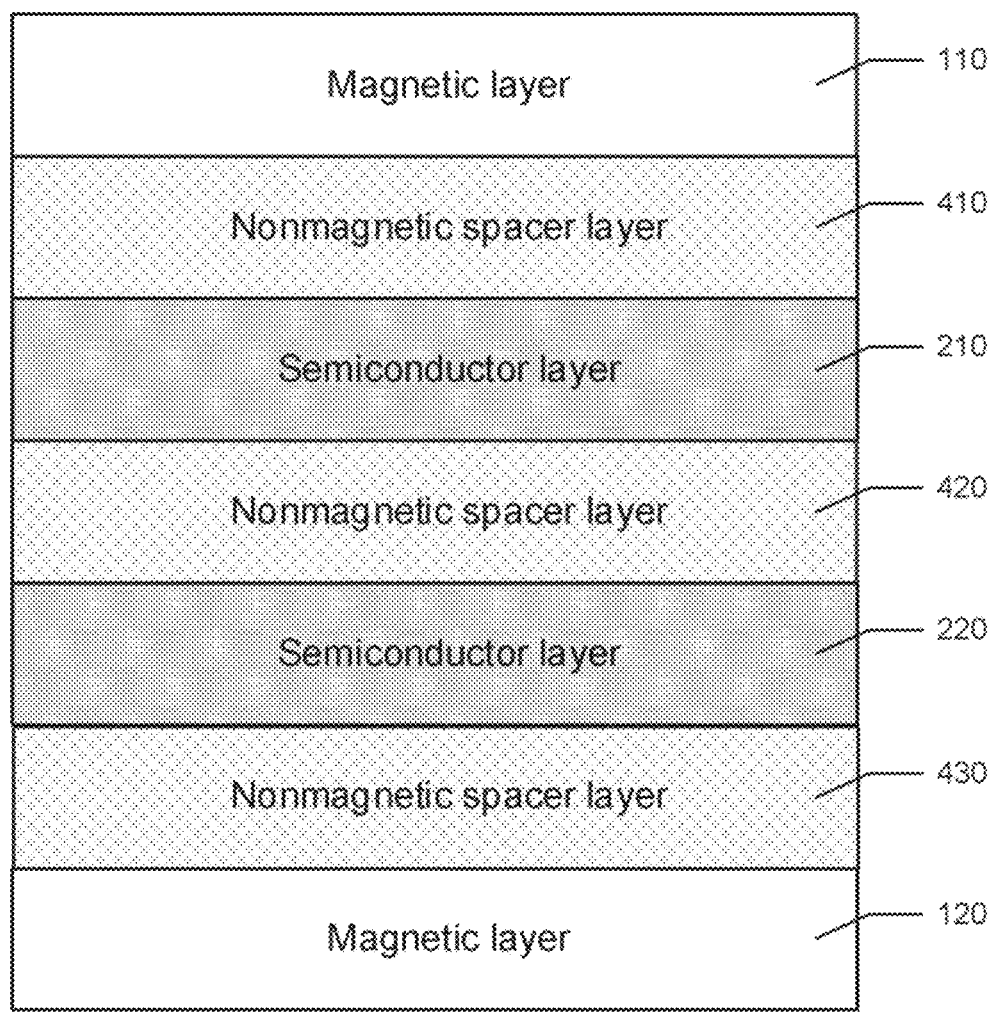
FIG. 3 illustrates a side view of a structure of a spin valve comprising a nonmagnetic spacer layer according to an exemplary embodiment of the present disclosure.

FIG. 3 illustrates a side view of a structure of a spin valve comprising a nonmagnetic spacer layer according to an exemplary embodiment of the present disclosure.

As shown in FIG. 3, the spin valve according to the exemplary embodiment may also comprise a nonmagnetic spacer layer. The nonmagnetic spacer layer may be arranged between any two layers of the spin valve shown in FIG. 1. For example, the nonmagnetic spacer layer 410 and/or 430 may be respectively arranged between the magnetic layer 110 and the semiconductor layer 210 and/or arranged between the semiconductor layer 220 and the magnetic layer 120, and configured for magnetically decoupling the magnetic layer 110 and the magnetic layer 120. The nonmagnetic spacer layer 420 may be arranged between the semiconductor layers 210 and 220, and configured to serve as a spacer layer for enhancing the built-in electric field between the two semiconductor layers. The nonmagnetic spacer layer may be made of at least one of a nonmagnetic semiconductor, a nonmagnetic insulator, a nonmagnetic semimetal, a nonmagnetic metal, and a nonmagnetic superconductor.

Although the inventive concept of the present disclosure is exemplarily illustrated with the spin valve comprising only two magnetic layers with reference to FIG. 1 to FIG. 3, it should be understood by those skilled in the art that the present disclosure is not limited thereto, and may comprise more magnetic layers.

Figure 4:
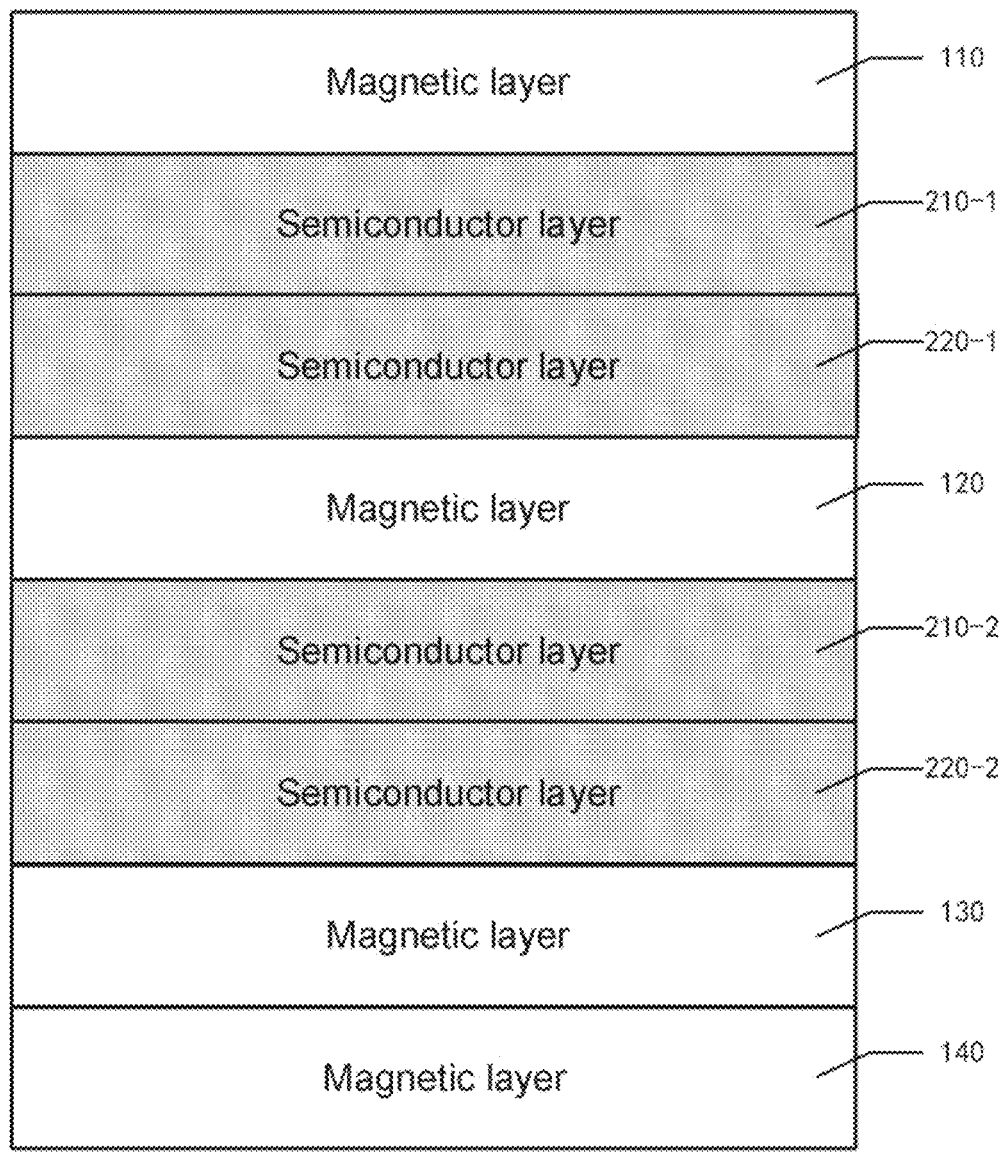
FIG. 4 illustrates a side view of an exemplary structure of a multistate spin valve according to an exemplary embodiment of the present disclosure.

FIG. 4 illustrates a side view of an exemplary structure of a multistate spin valve according to an exemplary embodiment of the present disclosure.

As shown in FIG. 4, the multistate spin valve according to the exemplary embodiment of the present disclosure may comprise a plurality of magnetic layers, e.g., magnetic layers 110, 120, 130 and 140. In the structure of the multistate spin valve, a plurality of logic states can be realized by controlling the magnetization directions of the magnetic layers via the application of an external magnetic field. It should be noted that, although the multistate spin valve herein is illustrated to comprise four magnetic layers, the present disclosure is not limited thereto. The multistate spin valve may comprise more (e.g., five, six, etc.) magnetic layers, or fewer (e.g., three) magnetic layers.

As described above, each of the magnetic layers may be made of at least one of a magnetic metal, a magnetic semimetal, a magnetic semiconductor, a magnetic superconductor, a magnetic insulator, a ferromagnetic material, an antiferromagnetic material, an in-plane magnetic anisotropic material, a vertical magnetic anisotropic material, an organic magnetic material, an inorganic magnetic material, and a van der Waals magnetic material.

One or both of any adjacent magnetic layers may have an unfixed magnetization direction, so that the magnetic moments of the adjacent magnetic layers may have a parallel configuration and antiparallel configuration by applying an external magnetic field, thereby realizing logic multistate. When one or some of the magnetic layers are implemented as the magnetic layer(s) having the fixed magnetization direction, and the other are implemented as the magnetic layer(s) having the unfixed magnetization direction, the magnetic layer having the unfixed magnetization direction may be provided with a specific magnetization direction by controlling the external magnetic field. In particular, when some of the magnetic layers needs to be implemented as the magnetic layer(s) having the fixed magnetization direction, the multistate spin valve may additionally comprise a pinning layer arranged above or below the corresponding magnetic layer(s) to fix the magnetization direction of these magnetic layers, as shown in FIG. 2.

In addition, it is seen that the multistate spin valve shown in FIG. 4 comprises a first pair of nonmagnetic semiconductor layers 210-1 and 220-1 and a second pair of nonmagnetic semiconductor layers 210-2 and 220-2. The first pair of nonmagnetic semiconductor layers 210-1 and 220-1 is arranged between the magnetic layers 110 and 120 to form a built-in electric field, thereby enhancing the spin effect between the magnetic layers 110 and 120. The second pair of nonmagnetic semiconductor layers 210-2 and 220-2 is arranged between the magnetic layers 120 and 130 to form a built-in electric field, thereby enhancing the spin effect between the magnetic layers 120 and 130. There is no pair of nonmagnetic semiconductor layers between the magnetic layers 130 and 140. It should be noted that the number and positions of the pairs of the nonmagnetic semiconductor layer pairs are not restrictive. Indeed, the pair of nonmagnetic semiconductor layer may be disposed between any two adjacent magnetic layers.

As described above in connection with FIG. 1, the pair of nonmagnetic semiconductor layers may be made of semiconductor materials with the same or different conductivities, as long as the built-in electric field can be formed between the pair of nonmagnetic semiconductor layers to enhance the spin effects in the upper magnetic layer and lower magnetic layer immediately adjacent thereto. As mentioned above, the pair of semiconductor layers can be not only made of traditional semiconductor materials with dopants, but also made of two-dimensional semiconductor materials.

Additionally, it should be clear to those skilled in the art that the multistate spin valve may also comprise one or more nonmagnetic spacer layer, as shown in connection with FIG. 3, so as to magnetically decouple the adjacent two magnetic layers, or to enhance the built-in electric field formed by the pair of semiconductor layers.

The self-driven spin valve according to an exemplary embodiment of the present disclosure has been described above. As mentioned above, the self-driven spin valve according to the exemplary embodiment of the present disclosure has a pair of nonmagnetic semiconductor layers between adjacent magnetic layers, and may operate under the driving of a small external biasing electric field or without the driving of the external biasing electric field. Thus, it is possible for the self-driven spin valve and the spintronic device including the same according to the exemplary embodiment of the present disclosure to operate at low power consumption or even zero power consumption in a harsh environment. Therefore, the self-driven spin valve according to the exemplary embodiment of the present disclosure is of great significance for the development of magnetic sensing, data storage and processing technologies as well as related information industries.

It should be noted that the thickness, shape, number, and the like of the magnetic layers in the accompanying drawings are illustrative and exemplary for explaining the present disclosure, and are not restrictive. The present disclosure is not limited thereto, and may include magnetic layers of other thickness, shape, number, and the like.

The self-driven spin valve according to the exemplary embodiment of the present disclosure may be applied to manufacture various spintronic devices, including but not limited to a magnetic detector, a magnetic sensor, a magnetic memory, a spin logic device, a spin oscillator, a spin transistor, a spin diode, or a temperature sensor. The spintronic device according to the exemplary embodiment of the present disclosure may be applied to all scenarios to which traditional GMR spin valves or TMR magnetic tunnel junctions may be applied. Therefore, these specific applications are not described in detail here.

It should be understood that; since no external biasing electric field is required, as compared with a spintronic device comprising a traditional spin value, the spintronic device comprising the self-driven spin valve according to the exemplary embodiment of the present disclosure not only has a stable performance but also has a wide application.

In addition, the terms used herein are merely for the purpose of describing the specific embodiments, and are not intended to limit the present disclosure. The words "a" "an" and "the" also include the meaning of "a plurality of" and "various", unless otherwise indicated clearly in the context. In addition, the terms "comprising", "including", etc. used herein indicate the presence of the features, steps, operations and/or parts, but do not exclude the presence or addition of one or more other features, steps, operations or parts.

It will be understood by those skilled in the art that the terms of ordinal words such as "first" and "second" may modify a variety of elements. However, these elements are not limited to the above words. For example, the above terms do not limit the order and/or importance of elements. The above terms are used only to distinguish one element from another element. For example, a first element may be referred to as a second element, and similarly, a second element may be referred to as a first element, without departing from the scope of the present disclosure.

The exemplary embodiments are described herein only for the purpose of explaining the present disclosure, not for limiting the scope of the present disclosure. As may be easily understood by those skilled in the art, all changes, modifications or equivalent replacements in any form and detail according to the concept and spirit of the present disclosure shall fall within the scope of the present disclosure. The scope of the present disclosure is defined by the appended claims and their equivalents.

We claim:

1. A spin valve comprising two or more magnetic layers stacked, wherein the spin valve further comprises:
   at least one pair of nonmagnetic semiconductor layers arranged between any two adjacent magnetic layers among the two or more magnetic layers, wherein a built-in electric field is formed between the at least one pair of nonmagnetic semiconductor layers,
   wherein the at least one pair of nonmagnetic semiconductor layers is made of semiconductor materials with different conductivities.

2. The spin valve according to claim 1, wherein at least one of the two or more magnetic layers has a fixed magnetization direction, and the other magnetic layer has an unfixed magnetization direction.

3. The spin valve according to claim 2, further comprising a pinning layer arranged above or below the at least one magnetic layer and configured to fix the magnetization direction of the at least one magnetic layer.

4. The spin valve according to claim 1, wherein each of the two or more magnetic layers is made of at least one of a magnetic metal, a magnetic semimetal, a magnetic semiconductor, a magnetic superconductor, a magnetic insulator, a ferromagnetic material, an antiferromagnetic material, an in-plane magnetic anisotropic material, a vertical magnetic anisotropic material, an organic magnetic material, an inorganic magnetic material, and a van der Waals magnetic material.

5. The spin valve according to claim 1, further comprising one or more nonmagnetic spacer layer arranged between the two or more magnetic layers.

6. The spin valve according to claim 5, wherein each of the one or more nonmagnetic spacer layers is made of at least one of a nonmagnetic semiconductor, a nonmagnetic insulator, a nonmagnetic semimetal, a nonmagnetic metal, and a nonmagnetic superconductor.

7. A spintronic device comprising the spin valve according to claim 1.

8. The spintronic device according to claim 7, wherein the spintronic device is a magnetic detector, a magnetic sensor, a magnetic memory, a spin logic device, a spin oscillator, a spin transistor, a spin diode, or a temperature sensor.

* * * * *